United States Patent [19]
Ambruoso, Sr. et al.

[11] 3,987,344
[45] Oct. 19, 1976

[54] PLUG-IN MODULE FOR ELECTRONIC DEVICE HAVING SELF-CONTAINED HEAT SINK

[75] Inventors: Pasquale Ambruoso, Sr., Coral Springs; Larry V. Douglass, Coconut Creek; Jack E. Jones, Coral Springs, all of Fla.

[73] Assignee: Motorola, Inc., Schaumberg, Ill.

[22] Filed: Mar. 10, 1975

[21] Appl. No.: 556,741

[52] U.S. Cl. .............................. 317/100; 339/17 M; 174/51
[51] Int. Cl.² ............................................ H05K 7/20
[58] Field of Search ............ 317/100, 101 C, 101 B, 317/101 D, 120; 174/51; 339/17 M, 17 N, 17 L, 17 LC, 17 LM, 14 R, 219 R

[56] References Cited
UNITED STATES PATENTS

| | | | |
|---|---|---|---|
| 3,621,112 | 11/1971 | Stickey | 174/51 |
| 3,631,299 | 12/1971 | Meyer | 317/120 |
| 3,736,547 | 5/1973 | Koenig | 339/14 R |
| 3,895,267 | 7/1975 | Gordon | 317/101 CB |

*Primary Examiner*—Gerald P. Tolin
*Attorney, Agent, or Firm*—Donald B. Southard; James W. Gillman

[57] ABSTRACT

A small plug-in module includes a combined housing and heat sink, and plug-in terminals cooperating with mating terminals on a chassis. The module includes guiding structure to facilitate insertion of the module on the chassis, which may also form terminals for providing a ground connection to the module. The module includes an electronic circuit with components, at least one of which develops substantial heat, such as a transistor. The components are positioned on a substrate which is mounted in heat conducting relation on the base of the housing. The base and/or sides of the housing are constructed to provide sufficient mass to dissipate the heat developed by the components. The housing-heat sink may have recesses into which spring inserts are placed to resiliently engage pins extending from the chassis to guide the module into position and provide a ground connection thereto. Alternatively, terminal pins can be secured to the heat sink to engage sockets on the chassis. A header is provided on the module from which plug-in contacts extend for connection to sockets on the chassis, to connect the circuit of the module to the chassis. The guiding of the module by the grounding pins facilitates the engagement of the more fragile plug-in contacts.

9 Claims, 7 Drawing Figures

PLUG-IN MODULE FOR ELECTRONIC DEVICE HAVING SELF-CONTAINED HEAT SINK

BACKGROUND OF THE INVENTION

It is desired to construct electronic devices with plug-in modules which can be quickly assembled in production, and easily replaced when defective or when it is desired to change the characteristics of the device. Such use of modules is desired to miniature electronic devices, such as a hand-held radio transmitter and receiver, but plug-in modules normally occupy more space than directly wired modules and there has not been room for plug-in modules within the specified size limitations. Further, there is a problem in providing small plug-in modules which have the desired degree of ruggedness and reliability.

The module may include an electronic circuit, such as a power amplifier circuit, having a transistor or other component which develops substantial heat when it is operating, and it is, therefore, necessary to conduct heat from the component to provide proper operation of the circuit. Prior miniature electronic circuits having components which develop substantial heat have been mounted on a large chassis to dissipate the heat, or have had the heat producing component mounted on a heat sink. In such case, the complete circuit is not provided as a plug-in module and requires wiring to connect the circuit to the chassis. This complicates testing of the complete circuit as a module before it is placed in the complete electronic device.

Although plug-in circuits have been provided in large electronic devices, it has not been possible to merely reduce the size to the extent desired and provide a satisfactory unit. Also, it has been difficult to insert small closely spaced modules having small fragile plug-in contacts on a chassis, and it has been necessary to space the modules to facilitate insertion thereof. This has resulted in the complete device being larger than desired.

SUMMARY OF THE INVENTION

It is an object of this invention to provide an improved miniature plug-in module for an electronic device.

A further object of this invention is to provide a plug-in module for an electronic circuit which develops power, having a compact housing-heat sink structure for dissipating the heat developed.

Another object of the invention is to provide a plug-in module for use on a chassis, wherein the module and chassis have cooperating guiding elements to facilitate the placement of closely spaced modules on the chassis.

Still another object of the invention is to provide a plug-in module for use on a chassis, wherein the module and chassis have relatively rugged terminals for guiding the module into position and for supporting the same, and fragile contact pins for connecting the circuit of the module to the chassis when the module is properly positioned.

A still further object of the invention is to provide a miniature plug-in module for an electronic device which forms a complete circuit unit which can be operated and tested, prior to insertion of the module on the chassis.

In practicing the invention, a plug-in module is provided having a heat conducting housing including a base and three side walls extending therefrom. A header formed of insulating material forms a fourth side, and a cover is sealed to the four sides forming a completely closed unit which has the ruggedness required of a plug-in unit. A substrate, which may be formed of ceramic, has circuit conductors and electronic components positioned thereon to form an electronic circuit, such as a power amplifier. This circuit includes an active element, such as a transistor, which develops substantial heat when operating. The substrate is mounted to the base of the housing in heat conducting relation therewith and the housing base and sides have sufficient mass to form a heat sink to dissipate heat developed by the circuit. The module includes terminal structure cooperating with mating structure on a chassis for mounting and interconnecting the same. The terminal structure includes relatively long heavy grounding pins which guide the module into position and relative short fragile pins extending from the header and connected to the circuit on the substrate for making connections from the circuit to the chassis. The guide pins may be mounted on the chassis and extend into elongated openings in the housing heat sink, with spring inserts in the openings to facilitate the guiding action and provide a resilient electrical connection. Alternatively, the pins can be mounted on the heat sink and extend into resilient sockets on the chassis.

DETAILED DESCRIPTION

Figure 1:
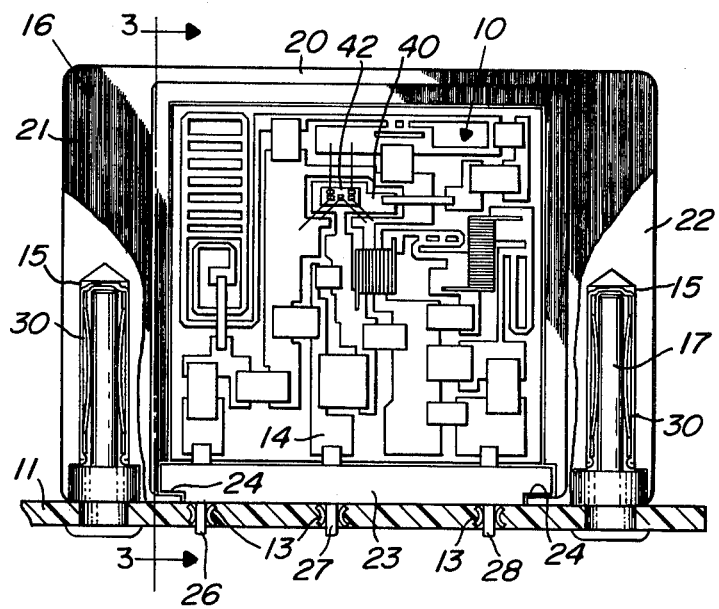
FIG. 1 is a top view of a power amplifier module showing the connection thereof to a chassis.
Figure 2:
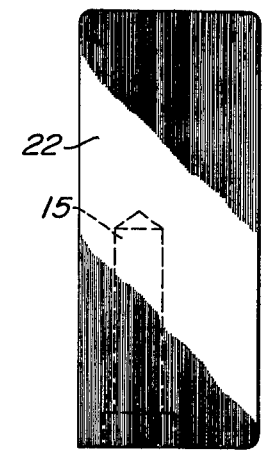
FIG. 2 is an end view of the housing of the module.
Figure 3:
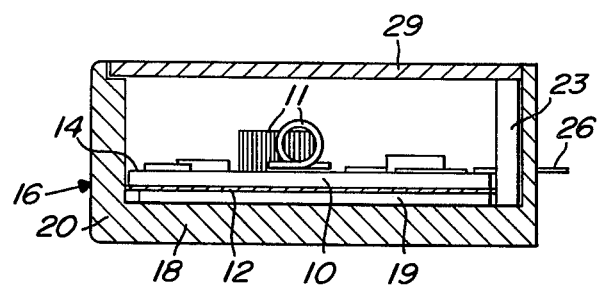
FIG. 3 is a cross-sectional view of the module of FIG. 1 along the lines 3–31 of FIG. 2.

FIGS. 1, 2 and 3 illustrate the construction of the plug-in module of the invention. The module may be a radio frequency power amplifier for a hand-held radio transmitter, but the invention is not limited to this particular application. The module includes a conducting housing 16 which has a base 18 with a raised central portion 19 which supports a ceramic substrate 10, and is electrically connected to a conducting coating 12 on the bottom side of the substrate 10. Electronic components 11 are supported on the top surface of the substrate 10 and connected to the conductors 14 thereon. The particular components and the connections thereof are not a part of this invention.

The housing 16 has a back wall 20 and side walls 21 and 22 which have substantial thickness. The housing base and walls have substantial mass and form an effective heat sink for any component on the substrate which develops substantial heat, such as a transistor. At the side opposite the back wall 20 is an insulating header 23, through which terminals 26, 27 and 28 extend. The ends of the header 23 fit into slots 24 at the front ends of the side walls 21 and 22 to hold the same in place. The terminals 26, 27 and 28 are connected to the conductors 14 on the top side of the substrate 10. To complete the enclosure for the unit, a top plate 29 made of conducting material is positioned in a ledge about the top of the walls 20, 21 and 22. The cover plate 29 is fixed to the walls, as by soldering or the use of a conductive cement, and extends across the top of the header 23 to hold the same in place. Prior to positioning the top plate 29, the components on the substrate are accessible through the open top of the housing.

The plug-in module forms a hybrid microelectronic unit which can be supported on a chassis 11, as shown by FIG. 1. The chassis 11 may be a printed circuit board which has sockets 13 thereon with spring conductors for receiving the conducting pins 26, 27 and 28, to make electrical connections to the module circuit. The side walls 21 and 22 of the housing 16 have elongated openings 15 therein in which conducting sleeves 30 are positioned to receive conducting pins 17 secured to the chassis 11 for making grounding connections thereto. These pins 17 may also provide some heat conduction to the chassis, although the housing itself provides adequate heat dissipation for the circuit which may be an amplifier.

As will be apparent from FIG. 1, the ground connecting pins 17 which extend from the chassis 11 into the sleeves 30 in the openings 15 in the housing 16 are longer than the conducting pins 26, 27 and 28 which extend from the unit. Accordingly, when the module is positioned on the chassis, the ground connecting pins 17 will fit into the sleeves 30 to align the module to facilitate the insertion of the conducting pins 26, 27 and 28 into the sockets 13 provided on the chassis.

Figure 4:
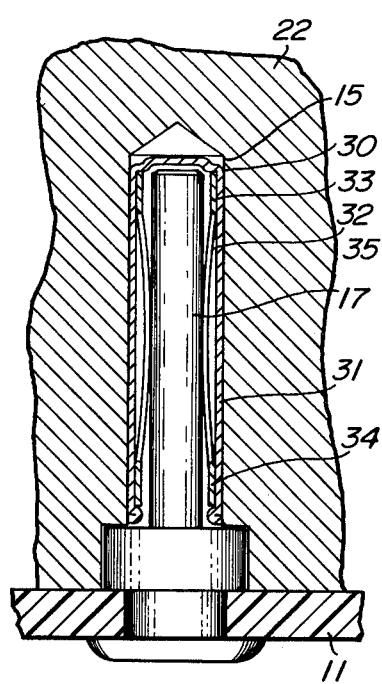
FIG. 4 is a detail view of the pin and socket structure of FIG. 1, showing the spring sleeve in the opening in the housing.
Figure 5:
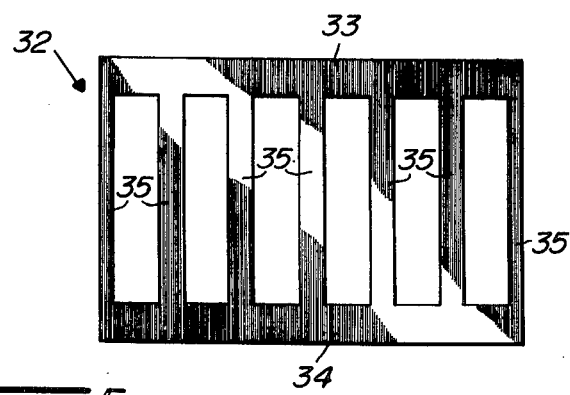
FIG. 5 is a developed view of the spring insert of the sleeve of FIG. 4.

FIGS. 4 and 5 shown in more detail the construction of the conducting sleeve 30, which in itself is a known item. Each sleeve 30 includes an outer tubular member 31 which is press fit into an elongated opening 15 in the housing 16. Within the member 31 is a spring member 32 which is shown in developed form in FIG. 5. This includes a pair of bands 33 and 34 between which elongated strips 35 extend. The bands 33 and 34 are formed into circular shape within the tubular member 31. The strips 35 are bowed as shown by FIG. 4, and form a plurality of resilient contacts which engage the pins 17 to make good electrical and mechanical connection thereto. The spring member 32 is formed of a resilient conducting material, and the bowed strips 35 flex to compensate for mechanical tolerances in the construction of the module and the placement of the pins on the chassis. Accordingly, the module is aligned when the pins 17 are inserted in the sleeves so that the conducting pins 26, 27 and 28 are properly positioned with respect to the sockets 13.

Although the invention is not directed to the circuit of the module, FIG. 1 shows the conductors 14 on the top surface of substrate 10, with the terminals 26, 27 and 28 for making connections to the circuit being shown along the bottom of the substrate. The terminal 26 is connected to one of the conductors 14 provided on the top side of the substrate 10, and may provide the signal input connection to the module. Conductor 40, provided on the substrate 10 as a part of the top conductor 14 thereon, has a portion on which a transistor die 42 is mounted. The die 42 has a collector electrode which is directly connected to the conductor 40 in heat conducting relation with the substrate 10. The terminal 27 may provide the positive supply potential to the circuit of the module. This terminal is connected to another part of the top conductor 14. The terminal 28, which may provide the signal output, is connected to another part of the conductor 14.

In assembling the components to the substrate, the transistor die 42 is first placed on the conductor 40. The die may have a base which is gold flashed, and the conductor 40 may be gold plated, so that the die can be mounted thereon by the use of an eutectic cement. This operation requires the highest temperature utilized in the assembling operation. As a second step, chip capacitors, air wound coils, chip inductors, resistors and bridges between the conductor portions may be soldered to the conductors 14 on the substrate by use of a lower temperature. These elements can all be soldered simultaneously. The third step is the mounting of the ceramic substrate to the base 18 of the housing 16 which forms the heat sink. This can be accomplished at a lower temperature so that it does not disturb the solder connections of the components or the connections of the transistor die.

After the substrate is mounted in the housing, the unit can be tested and tuned. Since the unit can be tested and adjusted after being completely assembled, further testing and/or adjustment is not required when the unit is placed in the equipment. The module can be used in a portable device, such as a radio transmitter, and it is merely necessary to plug in the module, with further tuning or adjustment not being required.

Figure 6:
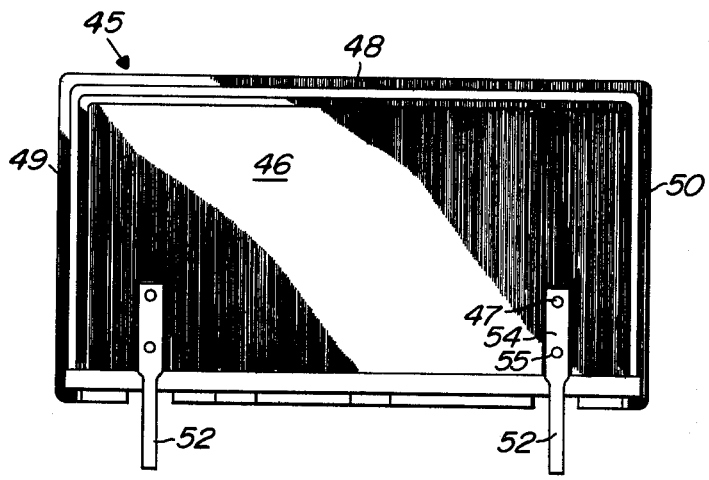
FIG. 6 is a top view of a second embodiment of a housing for a module in accordance with the invention.
Figure 7:
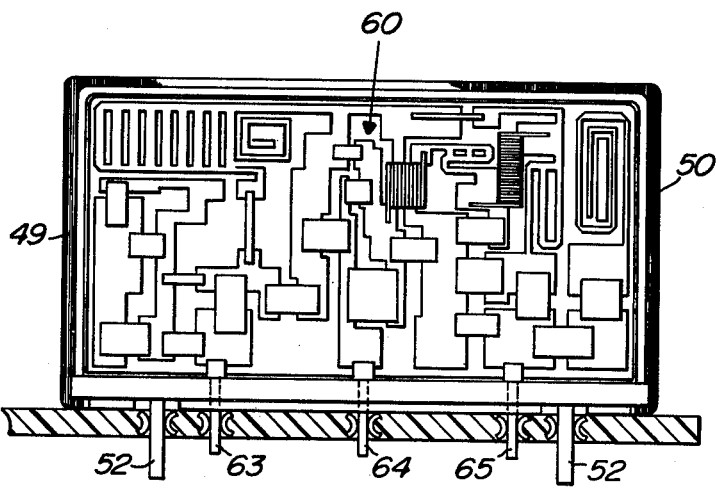
FIG. 7 shows the housing of FIG. 6 with the circuit thereon.

FIGS. 6 and 7 show a further embodiment of the housingheat sink structure of the invention. The housing 45 includes a base 46 and walls 48, 49 and 50, generally similar to that of the housing 16 in FIG. 1. Grounding pins 52 are secured to the base 46, as shown in FIG. 6. The pins have flat ends 54 with openings 55 therein which receive projections 47 provided on the base 46. The projections position the pins 52 and may be secured therto, as by swagging or welding, so that a good mechanical connection is provided. The subsequent soldering of the substrate to the base provides a good electrical connection between the pins and the housing.

FIG. 7 shows a substrate 60 positioned on the base 46 of the housing 45, with conductors and components thereon which may be similar to the construction shown by FIG. 1. A header is provided, which has ends positioned in slots in the sides 49 and 50 of the housing. Conducting pins 63, 74 and 65 extend through the header, having ends connected to conductors on the substrate 60. The pins have outer ends which form terminals for connecting the module to a chassis 68. This is illustrated in FIG. 7, which shows that the pins 52 secured to the housing are longer than the pins 63, 64 and 65, so that the pins 52 engage sockets on the chassis first to align the module and facilitate insertion of the more fragile plug-in terminals 63, 64 and 65. A cover can be placed on the housing sides and across the header, as in the structure of FIGS. 1 to 3.

In the structure of FIGS. 6 and 7, the housing walls are shown to have less thickness than in the structure of FIGS. 1 to 3, and this structure may be used for a module having less heat dissipation requirements. It is obvious that the dimensions of either unit can be varied as required for a particular application. As previously stated, the structures are suitable for use in miniature modules, and may be used in modules which have the two larger dimensions within the range from 0.7 to 1.3 inch, and the smallest dimension of the order of 0.25 inch.

The structure of the invention has been found to be highly advantageous to provide a small inexpensive electronic module. The housing can be accurately formed as a diecast aluminum part. The ceramic substrate with the electronic circuitry and components is soldered directly to the base of the housing, and the heat producing components are directly mounted on the substrate, so that a direct path is provided through the substrate to the housing for dissipating heat produced. The housing has sufficient mass to form a heat sink for the module so that an external heat sink is not required. The two ground connecting pins provide alignment of the module with respect to the chassis board, and form the primary structural support for shear loads between the module and the board. The pins may have different sizes and spacings to permit insertion only of the proper module in a particular position.

We claim:

1. A plug-in module for an electronic device having a chassis receiving the module, including in combination:
   a conducting housing having a base and three sides extending therefrom,
   first terminal means provided on said housing,
   a substrate mounted on said base of said housing having electronic components thereon, at least one of which develops substantial heat,
   said housing having sufficient mass to form a heat sink and being coupled to said substrate to effectively dissipate heat from said at least one heat generating component,
   a header adjacent said base and two sides of said housing forming a fourth side,
   a plurality of terminals extending through said header and having portions within said housing connected to said electronic components, said terminals having portions extending outside said housing forming plug-in contacts, and
   a cover secured to said three sides of said housing and engaging said header to completely enclose the module,
   said first terminal means mates with said chassis and aligns said plurality of terminals with the chassis, makes grounding connection between said housing and the chassis, and provides heat transfer from the chassis to said conductive housing, said terminals being connected to the chassis.

2. The structure of claim 1 including second terminal means connected to the chassis cooperating with said first terminal means and with said plug-in contacts, said second terminal means including first terminals cooperating with said first terminal means and engaging the same to align the module and second terminals receiving said plug-in contacts.

3. The structure of claim 2 wherein said first terminal means includes an elongated tubular surface in said housing, and said first terminal includes a conducting pin coupled to said tubular surface, said conducting pin extending from the chassis a distance greater than said plug-in contacts extend from the module.

4. The structure of claim 3 wherein said first terminal means includes a spring insert within said tubular surface in said housing, said spring insert having portions resiliently engaging said conducting pin.

5. The structure of claim 2 wherein said first terminal means includes a conducting pin connected to said housing, and said first terminal includes a socket for receiving said conducting pin, said conducting pin extending from the module a greater distance than said plug-in contacts.

6. The structure of claim 2 wherein said first terminal means and said first terminals of said second terminal means provide a ground connection to said housing and provide the primary support for the module with respect to the chassis.

7. The structure of claim 6 wherein said conducting housing is a die cast aluminum part.

8. The structure of claim 7 wherein said substrate is a flat ceramic member having a conducting coating on one side connected to said base of said housing, and conducting portions on the opposite side connected to said electronic components.

9. The structure of claim 8 wherein said one electronic component is a transistor having a portion thereof directly connected to a conducting portion on said opposite side of said substrate, with said portion of said transistor transferring heat to said substrate, and said substrate transferring heat to said housing.

* * * * *